(12) United States Patent
Guebels

(10) Patent No.: US 6,828,833 B1
(45) Date of Patent: Dec. 7, 2004

(54) CLIPPED COMPLEMENTARY METAL-OXIDE SEMICONDUCTOR

(75) Inventor: Pierre Paul Guebels, Pleasanton, CA (US)

(73) Assignee: Phaselink Corporation, Fremont, CA (US)

(*) Notice: Subject to any disclaimer, the term of this patent is extended or adjusted under 35 U.S.C. 154(b) by 0 days.

(21) Appl. No.: 10/661,622

(22) Filed: Sep. 15, 2003

(51) Int. Cl.$^7$ .................................................. H03B 1/00
(52) U.S. Cl. ........................ 327/112; 327/391; 326/83
(58) Field of Search ........................ 327/108–112, 170, 327/379, 389, 391, 205, 206, 309, 318, 321, 327, 328, 374, 376, 377; 326/26, 27, 82, 83

(56) References Cited

U.S. PATENT DOCUMENTS

| | | | | |
|---|---|---|---|---|
| 5,365,118 A | * | 11/1994 | Wilcox | 327/109 |
| 6,025,742 A | * | 2/2000 | Chan | 327/108 |
| 6,107,833 A | * | 8/2000 | Yoshida | 326/83 |
| 2002/0084825 A1 | * | 7/2002 | Hwang et al. | 327/328 |

* cited by examiner

*Primary Examiner*—Long Nguyen
(74) *Attorney, Agent, or Firm*—Rosenberg, Klein & Lee

(57) ABSTRACT

A CMOS-logic compliant output buffer design for clock signals which limits the output amplitude without shifting the DC cross point while preserving the duty cycle. The waveform's VOH is limited to a VOHmax value less than VDD and its VOL is limited to a VOLmin value grater than 0V. For charging, the output buffer circuit is open but the current is limited to charging the capacitive load to VOHmax which is less than VDD and the output buffer circuit is tri-stated when VOH reaches VOHmax. For discharging, the output buffer circuit is open, but the current is limited to discharging the capacitive load to VOLmin which is greater than 0V and the output buffer circuit is tri-stated when VOL reaches VOLmin. In this way, the signal amplitude and current consumption are reduced while maintaining sharp rising and falling edges as well as preserving the duty cycle.

21 Claims, 6 Drawing Sheets

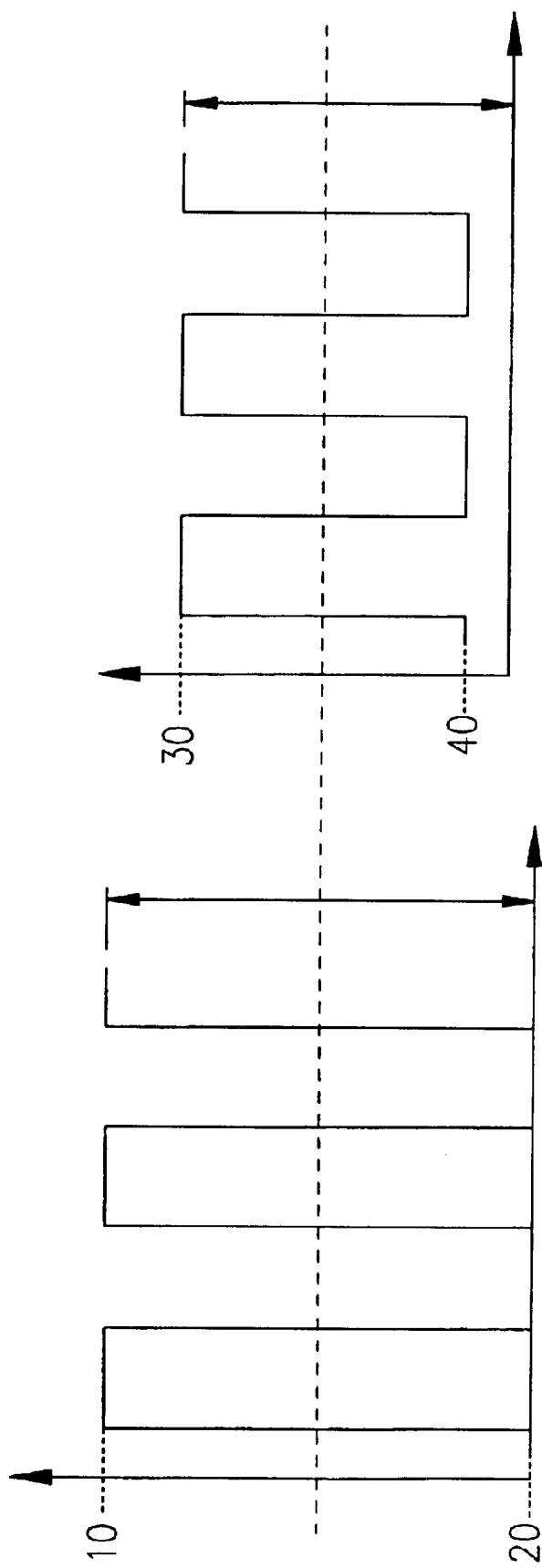

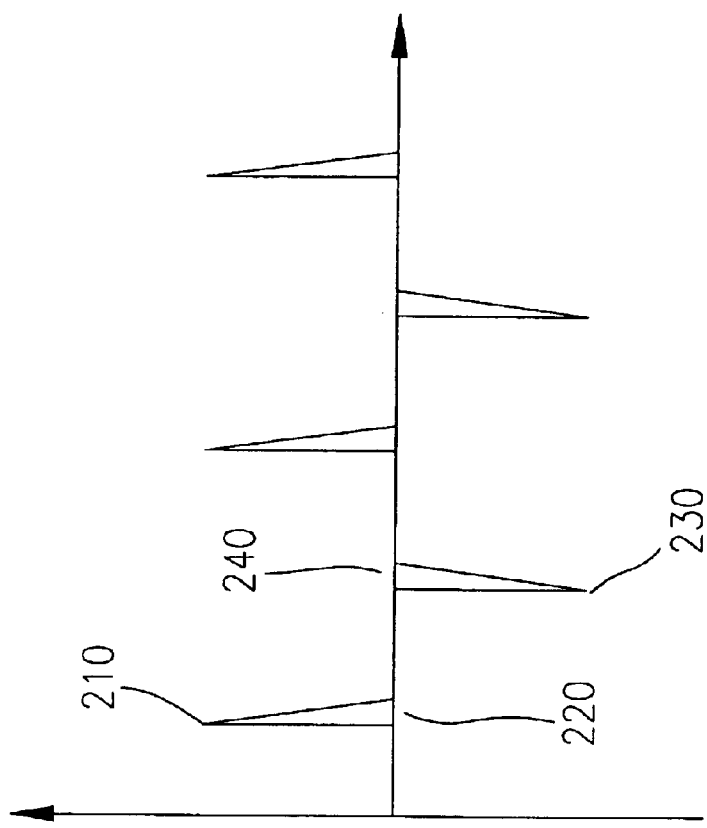
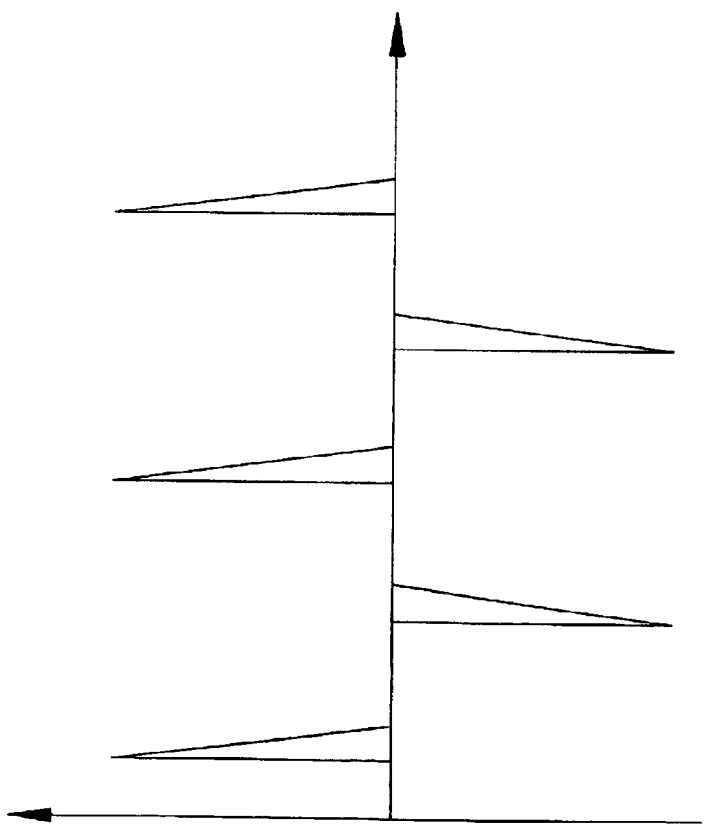

CLIPPED COMPLEMENTARY METAL-OXIDE SEMICONDUCTOR

BACKGROUND OF THE INVENTION

1. Field of the Invention

The present invention relates to a complementary metal-oxide semiconductor (CMOS) output buffer. More specifically, the present invention discloses a CMOS-logic compliant output buffer design for clock signals which limits the output amplitude without shifting the DC cross point while preserving the duty cycle.

2. Description of the Prior Art

Complementary Metal-Oxide Semiconductor (CMOS) output stages are used to drive the inputs of one of more downstream CMOS gates by changing the output from a logical 0 to a logical 1 and vice-versa. Typically, a CMOS output clock signal is used to change the output from 0 to 1 at a given frequency.

Several international standards specify requirements for CMOS logic at various levels. Examples of these standards are JEDEC standards JESD8B, JESD80, and JESD36.

The description of JEDEC requirements are essentially determined by the standard implementation of CMOS logic outputs, which in turn drive the inputs of CMOS logic gates.

However, these standards limit designers of CMOS output buffer stages. Particularly limiting are the requirements in terms of current consumption. These limits produce an undesirable minimum power consumption constraint for the CMOS output buffer circuitry in low power designs. Due to numerous factors, such as miniaturization of electronic components, there is an increasing demand for reduced power consumption as power is a critical factor in performance.

Furthermore, problems in low power CMOS output buffer design are even more critical when applied to output clock signals, because the current consumed is repeated for every clock cycle at the period of the clock. This repeated waste of consumed power quickly lowers performance.

Several approaches to resolving the output buffer current and power consumption problems have been attempted.

A first approach is to change the logic standard and abandon the CMOS logic. This technique uses an output driven by current as in current mode logic, or differential type outputs as in Low-Voltage Differential Signaling (LVDS).

This approach has the obvious drawback of no longer being compatible with CMOS logic and of not being capable of driving CMOS input gates. Therefore, this approach is not practical for CMOS logic circuitry or designs.

A second approach is to reduce the operating voltage supply in order to reduce the power consumption for a given current, under standard CMOS output buffer implementation. This technique has resulted in changes in the CMOS output buffer implementation, from 5V down to 3.3V, 2.5V, or 1.8V. This approach is sometimes referred to as Low Voltage CMOS (LVCMOS).

However, although this technique is still compliant with CMOS, it requires changes to both the output and input stages in order to be compatible with the lower voltage standard.

To date, there have been no acceptable solutions capable of reducing the current consumption without altering the CMOS standard.

Therefore, there is a need for a high speed, low power consumption CMOS output buffer that provides breakthrough performance while maintaining CMOS compatibility.

SUMMARY OF THE INVENTION

To achieve these and other advantages and in order to overcome the disadvantages of the conventional method in accordance with the purpose of the invention as embodied and broadly described herein, the present invention provides a clipped CMOS or CMOS-logic compliant output buffer design for clock signals which limits the output amplitude without shifting the DC cross point while preserving the duty cycle.

Under a given power supply voltage, for example VDD, the power consumption is linearly dependent on the current consumption. In a CMOS implementation, the current consumed is determined by the output load. In other words, the current consumed is determined by the sum of the capacitive loads connected to the output buffer.

This represents the current required to charge and discharge this capacitive load so as to bring the signal level of the output waveform to a logic 1 or voltage out high (VOH) of VDD when charging. When discharging, the signal level of the output waveform is brought to a logic 0 or voltage output low (VOL) of 0V.

Reaching the full VDD when charging and 0V when discharging, is called rail-to-rail swing. The only instance, im which the rail-to-rail swing is not achieved, is when the output signal is forced to change back to a logic 0 or 1 before charging or discharging is complete.

Such a reduced output amplitude phenomenon is generally considered an imperfection or flaw, as it results in rising and falling edges that are too slow for an adequate switching of the downstream stages. Furthermore, it often causes the duty cycle to become asymmetrical. However, the reduced amplitude will cause the total current consumption to be lower.

The present invention exploits the reduced current from the reduced amplitude, by limiting the output waveform's VOH to a VOHmax value less than VDD and its VOL to a VOLmin value greater than 0V in a controlled manner. This reduces the signal amplitude and current consumption, while maitaining sharp rising and falling edges as well as preserving the duty cycle.

Therefore, the present invention provides a CMOS-logic compliant output buffer that limits output amplitude without shifting the DC cross point.

As a result, the present invention provides the advantages of fast switching circuitry in line with high speed clock applications. Also, the present invention implements a threshold control symmetrical to the CMOS switching midpoint in order to preserve duty cycle. Furthermore, the present invention dramatically reduces current and power consumption of the output buffer stage as well as greatly reduces the total current and power consumption of the CMOS clock circuit.

An object of the present invention is to prevent the full signal swing of a voltage based output. By not providing a rail-to-rail output signal, the present invention provides benefits such as reduced power consumption, reduced switching time, and reduced Electromagnetic Interference (EMI).

These and other objectives of the present invention will become obvious to those of ordinary skill in the art after reading the following detailed description of preferred embodiments.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

In the drawings,

FIG. 1a is a diagram illustrating output voltage versus time in a standard implementation of the prior art;

FIG. 1b is a diagram illustrating output voltage versus time in a clipped CMOS implementation according to an embodiment of the present invention;

FIG. 2a is a diagram illustrating output current versus time in a standard implementation of the prior art;

FIG. 2b is a diagram illustrating output current versus time in a clipped CMOS implementation according to an embodiment of the present invention;

DESCRIPTION OF THE PREFERRED EMBODIMENTS

Figure 3:
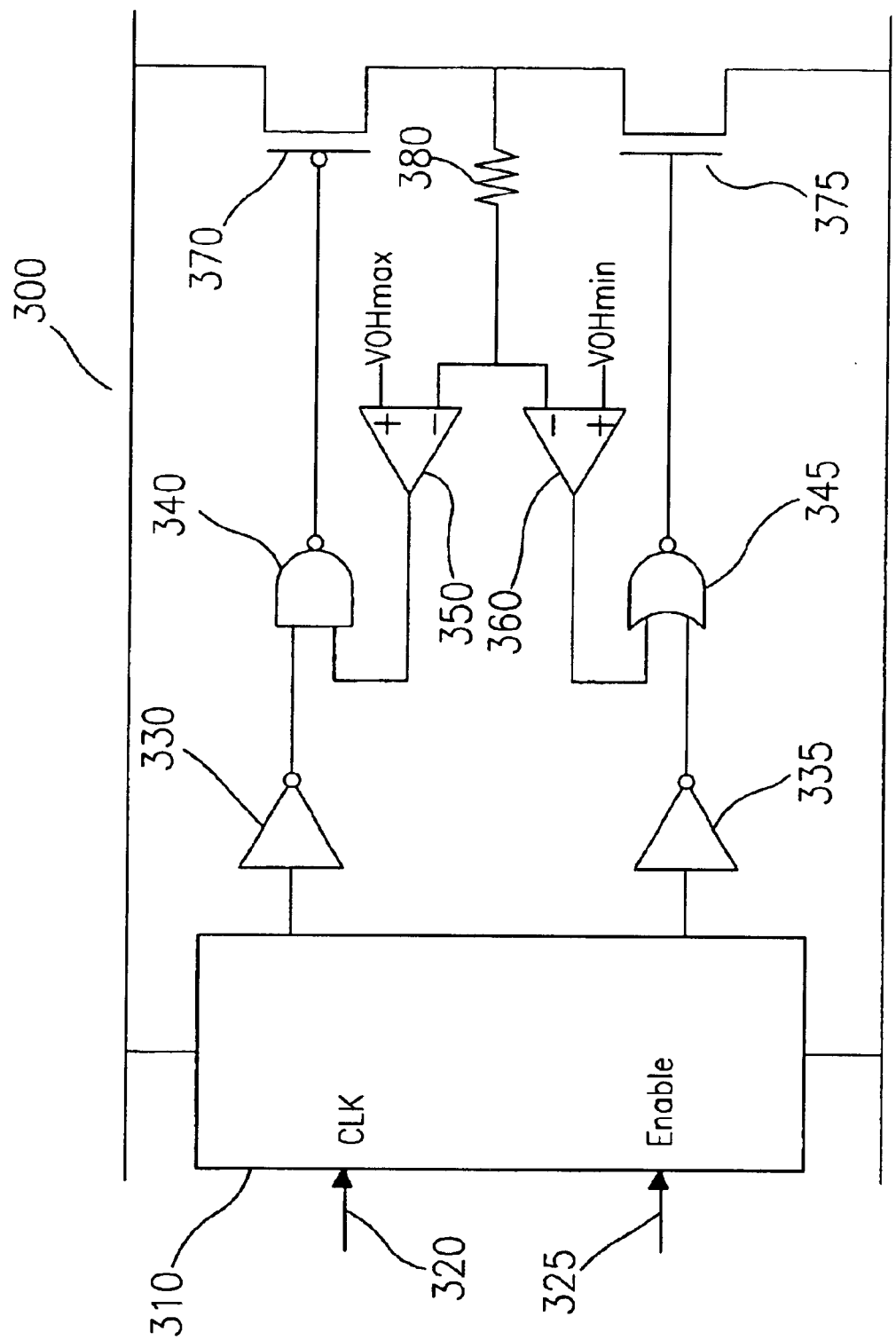
FIG. 3 is a schematic diagram illustrating a clipped CMOS implementation according to an embodiment of the present invention.

Reference will now be made in detail to the preferred embodiments of the present invention, examples of which are illustrated in the accompanying drawings. Wherever possible, the same reference numbers are used in the drawings and the description to refer to the same or like parts.

For a better understanding of invention, the output voltages and currents of the standard implementation and the present invention are compared.

Refer to FIG. 1a, which is a diagram illustrating output voltage versus time in a standard implementation and to FIG. 1b, which is a diagram illustrating output voltage versus time in a clipped CMOS implementation according to an embodiment of the present invention.

In FIG. 1a, the standard implementation has a VOHmax 10 equal to VDD and a VOLmin 20 equal to 0V.

In FIG. 1b, the present invention has a VOHmax 30 that is less than VDD and a VOLmin 40 that is greater than 0V.

For both FIGS. 1a and 1b, the midpoint symmetry is preserved.

Refer to FIG. 2a, which is a diagram illustrating output current versus time in a standard implementation and to FIG. 2b, which is a diagram illustrating output current versus time in a clipped CMOS implementation according to an embodiment of the present invention.

In FIG. 2a the output current versus time of a standard implementation is given for reference.

In FIG. 2b, at 210, the output buffer circuit is open but the current is limited to charging the capacitive load to VOHmax which is less than VDD. At 220, the output buffer circuit is tri-stated when VOH reaches VOHmax. At 230, the output buffer circuit is open, but the current is limited to discharging the capacitive load to VOLmin which is greater than 0V. At 210, the output buffer circuit is tri-stated when VOL reaches VOLmin.

Refer to FIG. 3, which is a schematic diagram illustrating a clipped CMOS implementation according to an embodiment of the present invention.

The invention 300 comprises pre-driver logic 310 with a clock input 320 and an enable 325. An output of the pre-driver logic 310 is fed into an inverter 330 with the output of the inverter 330 coupled to an input of a nand gate 340. A complementary output of the pre-driver logic 310 is fed into an inverter 335 with the output of the inverter 335 coupled to an input of a nor gate 345.

The other input to the nand gate 340 is coupled to the output of a first comparator 350. The other input to the nor gate 345 is coupled to the output of a second comparator 360.

The output of the nand gate 340 is coupled to the input of a PMOS 370. The output of the nor gate 345 is coupled to the input of an NMOS 375. Between the PMOS 370 and NMOS 375 is a resistor 380 coupled to the negative inputs of the first comparator 350 and the second comparator 360.

The positive input of the first comparator 350 is connected to VOHmax. The positive input of the second comparator 360 is connected to VOLmin.

Remember the present invention has a VOHmax that is less than VDD and a VOLmin that is greater than 0V.

As previously described in reference to FIG. 2b, at 210, the output buffer circuit is open but the current is limited to charging the capacitive load to VOHmax which is less than VDD. At 220, the output buffer circuit is tri-stated when VOH reaches VOHmax. At 230, the output buffer circuit is open, but the current is limited to discharging the capacitive load to VOLmin which is greater than 0V. At 210, the output buffer circuit is tri-stated when VOL reaches VOLmin.

To further illustrate the operation of the present invention as illustrated in FIG. 3, refer to FIGS. 4a–4d, which are schematic diagrams illustrating operating characteristics of the output buffer for clipped CMOS implementations according to an embodiment of the present invention.

Figures 4A, 4B, 4C, 4D:
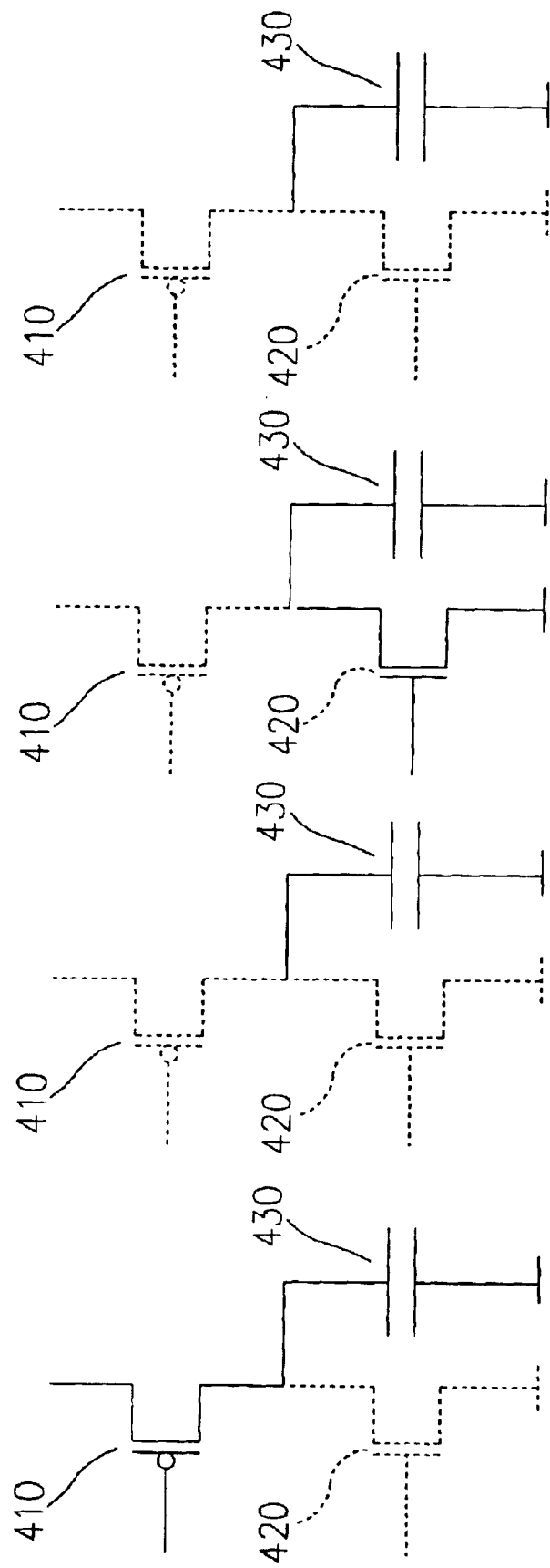
FIGS. 4a–4d are schematic diagrams illustrating operating characteristics of the output buffer for clipped CMOS implementations according to an embodiment of the present invention.

As shown in FIG. 4a, when charging the load capacitor 430, the comparator maintains the PMOS 410 open as long as VOH is less than VOHmax. As shown in FIG. 4b, when VOH reaches VOHmax, the output buffer is tri-stated As shown in FIG. 4c, when discharging the load capacitor 430, the comparator maintains the NMOS 420 open as long as VOL is greater than VOLmin. As shown in FIG. 4d, when VOL reaches VOLmin, the output buffer is tri-stated.

In summary, for charging, the output buffer circuit is open but the current is limited to charging the capacitive load to VOHmax which is less than VDD and the output buffer circuit is tri-stated when VOH reaches VOHmax. For discharging, the output buffer circuit is open, but the current is limited to discharging the capacitive load to VOLmin which is greater than 0V and the output buffer circuit is tri-stated when VOL reaches VOLmin.

Figure 5:
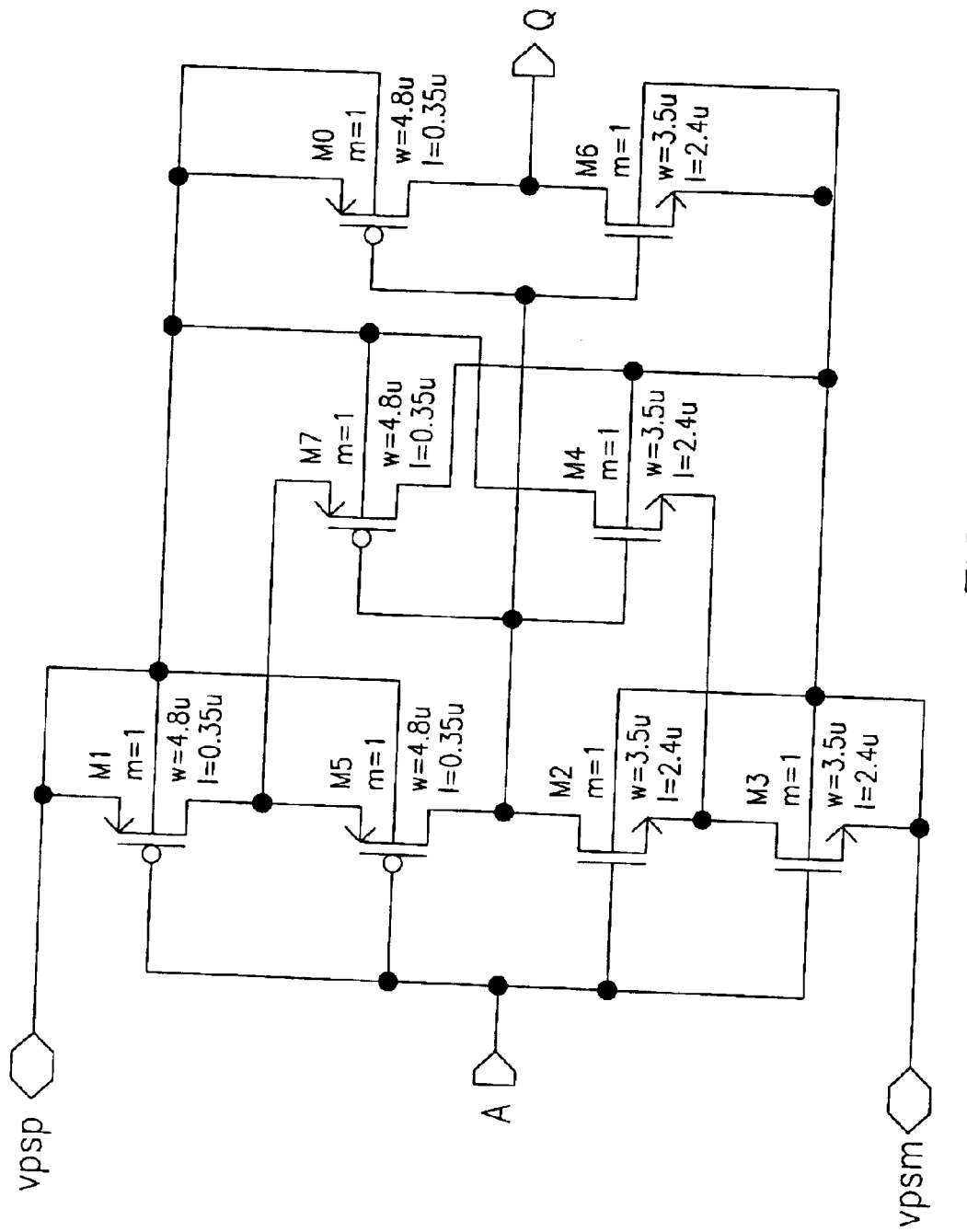
FIG. 5 is a schematic diagram illustrating implementation of a fast comparator for clipped CMOS according to an embodiment of the present invention.

Refer to FIG. 5, which is a schematic diagram illustrating implementation of a fast comparator for clipped CMOS according to an embodiment of the present invention.

In order to maintain symmetry around the midpoint for VOHmax and VOLmin, the present invention utilizes a comparator with fast switching capability as shown in FIG. 5.

The circuit 500 comprises PMOS M1, M5, M7, M0 and NMOS M2, M3, M4, M6. The circuit 500 has a positive power VPSP and a negative power VPSM. The input to the circuit is labelled as A and the output as Q.

Basically, when the input A is at a logic low, PMOS M1 and M5 are on and NMOS M2 and M3 are off. When the input A is at a logic high, PMOS M1 and M5 are off and NMOS M2 and M3 are on.

M2 can be considered as a main switching device, while M3 and M4 act as a feed-back network, controlling the triggering voltage. M3 turns on when the input voltage is equal to the threshold voltage of the NMOS.

When increasing the input voltage, M2 turns on and the output node is discharged through M3 and M2 and M4 is turned off.

When M3 is on and the output remains high, a short-circuit current through M3 and M4 causes a significant power dissipation during the forward switching phase. Another short-circuit current through M1 and M7 occurs in the reverse phase. A similar analysis of the PMOS elements in the circuitry can be made.

The circuit 500 in FIG. 5 provides a comparator fulfilling the switching time performance requirements of the present invention. In this way, the highly symmetrical VOHmax and VOLmin around the midpoint is achieved.

It is noted that in some embodiments of the present invention, a comparator circuit as shown in FIG. 5 is utilized. However, in other embodiments of the present invention, other comparator circuitry is used. For example, utilizing a Schmitt trigger provides an excellent implementation of the comparator requirements of the present invention to achieve optimum switching time performance and high symmetry of VOHmax and VOLmin around the midpoint.

Figure 6A:
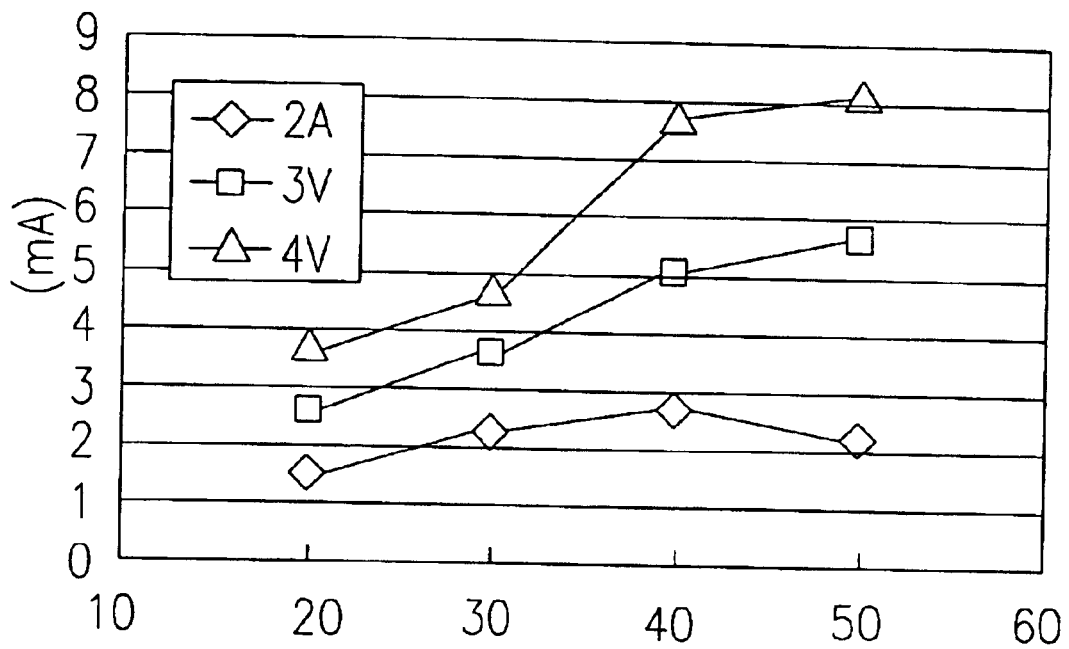
FIG. 6a is a graph illustrating performance of the standard implementation of the prior art.
Figure 6B:
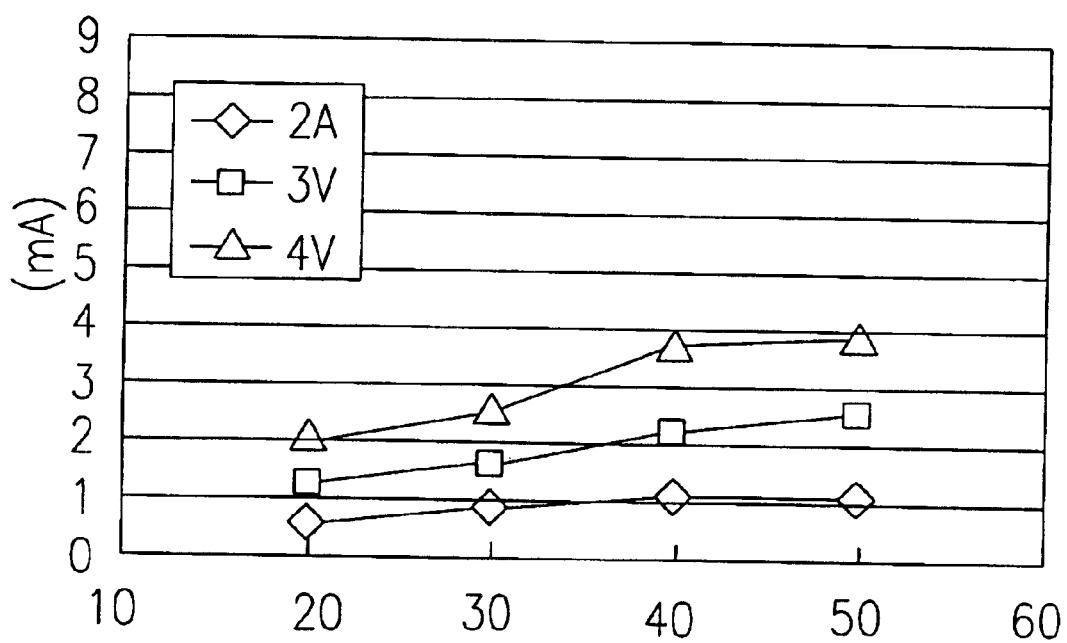
FIG. 6b is a graph illustrating performance of the clipped CMOS according to an embodiment of the present invention.

Refer to FIG. 6a, which is a graph illustrating performance of the standard implementation and to FIG. 6b, which is a graph illustrating performance of the clipped CMOS according to an embodiment of the present invention.

When comparing the performance of a standard implementation to the present invention, the benefits of the present invention are immediately recognized.

As shown in the figures, the current consumption of the output buffer stage of the present invention is reduced by 60 percent from that of the conventional implementation. Furthermore, the power consumption of the output buffer stage of the present invention is reduced by 60 percent from that of the conventional circuitry.

Additionally, the total current consumption of the CMOS clock circuit of the present invention is reduced by 40 percent from that of the traditional circuit. Also, the total power consumption of the CMOS clock circuit of the present invention is reduced by 40 percent from that of the standard implementation.

Therefore, the present invention provides a CMOS-logic compliant output buffer that limits output amplitude without shifting the DC cross point.

As a result, the present invention provides the advantages of fast switching circuitry in line with high speed clock applications. Also, the present invention implements a threshold control symmetrical to the CMOS switching midpoint in order to preserve duty cycle. Furthermore, the present invention dramatically reduces current and power consumption of the output buffer stage as well as greatly reduces the total current and power consumption of the CMOS clock circuit.

An object of the present invention is to prevent the full signal swing of a voltage based output. By not providing a rail-to-rail output signal, the present invention provides benefits such as reduced power consumption, reduced switching time, and reduced Electromagnetic Interference (EMI).

While the above description focuses on an output buffer, the clipped CMOS of the present invention has numerous applications. In embodiments of the present invention, the clipped CMOS is applied in differential pair circuitry. When applied to a differential pair the reduction in EMI is substantial.

Additionally, while CMOS circuitry has been given as example, circuitry of other processes can also enjoy the benefits and advantages by implementing the clipped or reduced output signal of the present invention.

It will be apparent to those skilled in the art that various modifications and variations can be made to the present invention without departing from the scope or spirit of the invention. In view of the foregoing, it is intended that the present invention cover modifications and variations of this invention provided they fall within the scope of the invention and its equivalent.

What is claimed is:

1. A complementary metal-oxide semiconductor (CMOS) output buffer comprising:

a pre-driver logic, comprising a clock input, an enable input, a first output, a second output, a positive power input, and a negative power input;

a first inverter, comprising a first inverter input and a first inverter output;

a second inverter, comprising a second inverter input and a second inverter output;

a nand gate, comprising a first nand gate input, a second nand gate input, and a nand gate output;

a nor gate, comprising a first nor gate input, a second nor gate input, and a nor gate output;

a first comparator, comprising a first comparator positive input, a first comparator negative input, and a first comparator output;

a second comparator, comprising a second comparator positive input, a second comparator negative input, and a second comparator output;

a resistor, comprising a first end and a second end;

a p-channel metal-oxide semiconductor (PMOS), comprising a PMOS gate, a PMOS source, and a PMOS drain; and an n-channel metal oxide semiconductor (NMOS), comprising an NMOS gate, an NMOS source, and an NMOS drain;

whereby, the first output of the pre-driver logic is coupled to the first inverter input and the first inverter output is coupled to the first nand gate input and the second output of the pre-driver logic is coupled to the second inverter input and the second inverter output is coupled to the first nor gate input;

whereby, the second nand gate input is coupled to the first comparator output and the second nor gate input is coupled to the second comparator output;

whereby, the nand gate output is coupled to the PMOS gate and the nor gate output is coupled to the NMOS gate;

whereby, the PMOS source and the positive power input are coupled to a first positive power supply and the NMOS source and the negative power input are coupled to a first negative power supply;

whereby, the PMOS drain, NMOS drain, and the first end of the resistor are coupled together;

whereby, the second end of the resistor, the first comparator negative input, and the second comparator negative input are coupled together;

whereby, the first comparator positive input is coupled to a second positive power supply and the second comparator positive input is coupled to a second negative power supply; and whereby, the second positive power supply is less than the first positive power supply and the second negative power supply is greater than the first negative power supply.

2. The complementary metal-oxide semiconductor (CMOS) output buffer of claim 1, whereby the first comparator and the second comparator are Schmitt triggers.

3. The complementary metal-oxide semiconductor (CMOS) output buffer of claim 1, whereby a maximum voltage level of an output waveform of the output buffer is less than a maximum voltage level of the first positive power supply.

4. The complementary metal-oxide semiconductor (CMOS) output buffer of claim 1, whereby a minimum voltage level of an output waveform of the output buffer is greater than a minimum voltage level of the first negative power supply.

5. The complementary metal-oxide semiconductor (CMOS) output buffer of claim 1, whereby a minimum voltage level of an output waveform of the output buffer is greater than zero volts.

6. The complementary metal-oxide semiconductor (CMOS) output buffer of claim 1, whereby midpoint symmetry of an output waveform of the output buffer is preserved.

7. The complementary metal-oxide semiconductor (CMOS) output buffer of claim 1, whereby when charging a load coupled to the output buffer, the first comparator maintains the PMOS open while a maximum voltage level of an output waveform of the output buffer is less than a voltage level of the second positive power supply.

8. The complementary metal-oxide semiconductor (CMOS) output buffer of claim 7, whereby when the maximum voltage level of the output waveform equals the voltage level of the second positive power supply, the output buffer is tri-stated.

9. The complementary metal-oxide semiconductor (CMOS) output buffer of claim 1, whereby when discharging a load coupled to the output buffer, the second comparator maintains the NMOS open while a minimum voltage level of an output waveform of the output buffer is greater than a voltage level of the second negative power supply.

10. The complementary metal-oxide semiconductor (CMOS) output buffer of claim 9, whereby when the minimum voltage level of the output waveform equals the voltage level of the second negative power supply, the output buffer is tri-stated.

11. A complementary metal-oxide semiconductor (CMOS) output buffer comprising:

a pre-driver logic, comprising a clock input, an enable input, a first output, a second output, positive power input, and a negative power input;

a first inverter, comprising a first inverter input and a first inverter output;

a second inverter, comprising a second inverter input and a second inverter output;

a nand gate, comprising a first nand gate input, a second nand gate input, and a nand gate output;

a nor gate, comprising a first nor gate input, a second nor gate input, and a nor gate output;

a first comparator, comprising a first comparator positive input, a first comparator negative input, and a first comparator output;

a second comparator, comprising a second comparator positive input, a second comparator negative input, and a second comparator output;

a resistor, comprising a first end and a second end;

a p-channel metal-oxide semiconductor (PMOS), comprising a PMOS gate, a PMOS source, and a PMOS drain; and an n-channel metal oxide semiconductor (NMOS), comprising an NMOS gate, an NMOS source, and an NMOS drain;

whereby, the first output of the pre-driver logic is coupled to the first inverter input and the first inverter output is coupled to the first nand gate input and the second output of the pre-driver logic is coupled to the second inverter input and the second inverter output is coupled to the first nor gate input;

whereby, the second nand gate input is coupled to the first comparator output and the-second nor gate input is coupled to the second comparator output;

whereby, the nand gate output is coupled to the PMOS gate and the nor gate output is coupled to the NMOS gate;

whereby, the PMOS source and the positive power input are coupled to a first positive power supply and the NMOS source and the negative power input are coupled to a first negative power supply;

whereby, the PMOS drain, NMOS drain, and the first end of the resistor are coupled together;

whereby, the second end of the resistor, the first comparator negative input, and the second comparator negative input are coupled together; and whereby, the first comparator positive input is coupled to a second positive power supply and the second comparator positive input is coupled to a second negative power supply.

12. The complementary metal-oxide semiconductor (CMOS) output buffer of claim 11, whereby the second positive power supply is less than the first positive power supply and the second negative power supply is greater than the first negative power supply.

13. The complementary metal oxide semiconductor (CMOS) output buffer of claim 11, whereby the first comparator and the second comparator are Schmitt triggers.

14. The complementary metal-oxide semiconductor (CMOS) output buffer of claim 11, whereby a maximum voltage level of an output waveform of the output buffer is less than a maximum voltage level of the first positive power.

15. The complementary metal-oxide semiconductor (CMOS) output buffer of claim 11, whereby a minimum voltage level of an output waveform of the output buffer is greater than a minimum voltage level of the first negative power supply.

16. The complementary metal-oxide semiconductor (CMOS) output buffer of claim 1, whereby a minimum voltage level of an output waveform of the output buffer is greater than zero volts.

17. The complementary metal-oxide semiconductor (CMOS) output buffer of claim 11, whereby midpoint symmetry of an output waveform of the output buffer is preserved.

18. The complementary metal-oxide semiconductor (CMOS) output buffer of claim 11, whereby when charging a load coupled to the output buffer, the first comparator maintains the PMOS open while a maximum voltage level of an output waveform of the output buffer is less than a voltage level of the second positive power supply.

19. The complementary metal-oxide semiconductor (CMOS) output buffer of claim 18, whereby when the maximum voltage level of the output waveform equals the voltage level of the second positive power supply, the output buffer is tri-stated.

20. The complementary metal-oxide semiconductor (CMOS) output buffer of claim 11, whereby when discharging a load coupled to the output buffer, the second comparator maintains the NMOS open while a minimum voltage level of an output waveform of the output buffer is greater than a voltage level of the second negative power supply.

21. The complementary metal-oxide semiconductor (CMOS) output buffer of claim 20, whereby when the minimum voltage level of the output waveform equals the voltage level of the second negative power supply, the output buffer is tri-stated.

* * * * *